(12) United States Patent
Ishikawa

(10) Patent No.: US 7,183,491 B2
(45) Date of Patent: Feb. 27, 2007

(54) PRINTED WIRING BOARD WITH IMPROVED IMPEDANCE MATCHING

(75) Inventor: Kiyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 229 days.

(21) Appl. No.: 10/740,459

(22) Filed: Dec. 22, 2003

(65) Prior Publication Data

US 2004/0144562 A1 Jul. 29, 2004

(30) Foreign Application Priority Data

Jan. 27, 2003 (JP) .............................. 2003-017291

(51) Int. Cl.
*H05K 7/06* (2006.01)
(52) U.S. Cl. .................... 174/255; 174/261; 174/262; 174/524; 174/534; 174/557; 257/737; 257/776
(58) Field of Classification Search ................ 174/255, 174/260–266, 52.4, 52.2; 361/761–763; 257/737
See application file for complete search history.

(56) References Cited

U.S. PATENT DOCUMENTS

| | | | | | |
|---|---|---|---|---|---|
| 4,998,159 A | * | 3/1991 | Shinohara et al. | .......... | 361/809 |
| 5,488,542 A | * | 1/1996 | Ito | .............. | 361/793 |
| 5,569,390 A | * | 10/1996 | Endo | ........................ | 250/208.1 |
| 5,586,006 A | * | 12/1996 | Seyama et al. | .............. | 361/719 |
| 6,191,479 B1 | * | 2/2001 | Herrell et al. | ............... | 257/724 |
| 6,555,763 B1 | * | 4/2003 | Hirasawa et al. | ........... | 174/264 |
| 6,803,655 B2 | * | 10/2004 | Fujio et al. | ................. | 257/724 |
| 6,855,892 B2 | * | 2/2005 | Komatsu et al. | ............ | 174/256 |
| 2002/0074162 A1 | * | 6/2002 | Su et al. | ...................... | 174/262 |

FOREIGN PATENT DOCUMENTS

| JP | 5-029772 | | 2/1993 |
|---|---|---|---|
| JP | 05029772 A | * | 2/1993 |

* cited by examiner

*Primary Examiner*—Dean A. Reichard
*Assistant Examiner*—Hoa C. Nguyen
(74) *Attorney, Agent, or Firm*—Staas & Halsey LLP

(57) ABSTRACT

To provide a printed wiring board where the impedance between pads through which differential signals pass has been set to a predetermined standard value. The printed wiring board includes a first conductor layer extending over an area excluding a hole formed for each pad group and filled with a dielectric, and a second conductor layer extending over an area containing areas facing the hole. The hole encompasses a plurality of areas facing predetermined respective pads which are adjacent to each other and which form the pad group from among the plurality of pads.

6 Claims, 10 Drawing Sheets

PRINTED WIRING BOARD WITH IMPROVED IMPEDANCE MATCHING

BACKGROUND OF THE INVENTION

1. Field of the Invention

The present invention relates to a printed wiring board having plural pads arranged thereon and with plural wires extending from the pads.

2. Description of the Related Art

Signal transmission among devices interconnected via a network such as a LAN (Local Area Network) has been speeded up recently and signals in GHz bands are sent and received by high-speed serial transmission.

FIG. 1 is a diagram conceptually showing a network which sends and receives signals by high-speed serial transmission.

FIG. 1 shows HCAs (Host Channel Adapters) 100 which serve, for example, as signal interfaces for personal computers, TCAs (Target Channel Adapters) 300 which serve, for example, as signal interfaces for peripheral devices, and switches 400 which switch connections between the HCAs 100 and TCAs 300.

FIG. 2 is a diagram showing a PCI (Peripheral Component Interconnect) card, which is an example of the HCAs 100 shown in FIG. 1.

The PCI card 110 shown in FIG. 2 serves, for example, as a signal interface for a personal computer, as described above. For example, parallel signals generated in the personal computer are input in a SerDes (Serializer Deserializer) element 112, which is a serial/parallel signal conversion element mounted on the PCI card 110, through a path not shown. The parallel signals are converted into high-speed serial signals by the SerDes element 112 and output to the network via signal lines 113 and a connector 111.

In recent years, high-speed serial signals passing through signal lines are in GHz bands as described above. When designing a printed wiring board equipped with signal lines along which such high-speed signals travel, the impedance of the signal lines should be set to a standard value specified by a predetermined communications standard in order to ensure an impedance match among various points from the start point to the end point of the signal transmission path.

Most of the signal lines formed on the top surface of a printed wiring board are composed of pads and wires extending from the pads, where the pads are connected to terminals of a circuit element and the wires are thinner than the pads. In these signal lines, the pads and wires have their impedance set to the same standard value.

Recently, transmission of high-speed serial signals has been migrating from single-ended mode which uses a single signal line to differential mode which uses two signal lines.

Thus, a method of setting impedance in conventional single-ended mode will be described below first.

In the design of a printed wiring board, a conventionally used technique involves first setting the impedance of wiring composing a signal line to a predetermined standard value (e.g., 50Ω) mainly by setting the dimension in the thickness direction of the printed wiring board appropriately, and then setting the impedance of the pads connected to the wiring to the same standard value, taking care not to change the dimension in the thickness direction.

Thus, a method of setting wiring impedance will be described first, and then a method of setting pad impedance will be described.

FIG. 3 is a schematic sectional view of a printed wiring board 120 which has single-ended mode wiring formed on its top surface.

FIG. 3 shows wires 121 formed on the top surface, a first conductor layer 122 formed on the top surface by keeping clear of the wires 121, a second conductor layer 124 formed on the bottom surface, and a uniformly thick dielectric 123 sandwiched between the wires 121/first conductor layer 122 and second conductor layer 124.

In the printed wiring board 120, the impedance between the second conductor layer 12.4 and the wires 121 has been set to a predetermined standard value.

The impedance between the second conductor layer 124 and wires 121 decreases when the width W of each wire 121 increases, and increases when the thickness T of the dielectric 123 sandwiched between the second conductor layer 124 and the wires 121 increases.

Generally, when a signal travels along wiring, if the wiring is narrow, the signal is attenuated in a short distance. Thus, in order for a signal to travel along wiring of a certain length without significant attenuation, the width of the wiring must be set to an appropriate value commensurate with its length.

In the design of the printed wiring board 120 shown in FIG. 3, first the width W of each wire 121 is determined based on the length of each wire 121. Then, the thickness T of the dielectric 123 is set to an appropriate value, whereby the impedance between the second conductor layer 124 and the wires 121 is set to a predetermined standard value.

Next, description will be given of a method of setting impedance of single-ended mode wiring formed in a printed wiring board.

FIG. 4 is a diagram showing part of a printed wiring board 130 in which wiring has been formed.

FIG. 4 shows a first conductor layer 131, a second conductor layer 132, a dielectric 133 sandwiched between the two conductor layers 131 and 132, and two wires 134a and 134b installed in the dielectric 133 and extending parallel to the two conductor layers 131 and 132.

In the printed wiring board 130 shown in FIG. 4, as is the case with the printed wiring board 120 shown in FIG. 3, the width W of the two wires 134a and 134b is determined based on the length of the wire 134a. Then, the thickness Ta of the dielectric sandwiched between the wire 134a and conductor layer 131, the thickness Tb of the dielectric sandwiched between the wire 134b and conductor layer 131, and the overall thickness Tt of the dielectric 133 sandwiched between the two conductor layers 131 and 132 are set to appropriate values, whereby the impedance of the two wires 134a and 134b is set to a predetermined standard value.

Next, description will be given of a method of setting pad impedance in single-ended mode.

The pads formed on the top surface of the printed wiring board are connected to terminals of a circuit element mounted on the printed wiring board. Thus, the width of the pads depends on the terminal width and spacing of the circuit element.

FIG. 5 is a diagram showing an example of a circuit element.

The terminal width Wdev and spacing Pi of the circuit element 500 shown in FIG. 5 determine the width of the pads connected with the terminals.

FIG. 6 is a partial-sectional view showing part of the printed wiring board on which the circuit element 500 shown in FIG. 5 is mounted.

FIG. 6 shows pads 141 connected with the terminals of the circuit element 500 (see FIG. 5) mounted on a printed wiring board 140, a conductor layer 144 extending parallel to the pads 141, and a uniformly thick dielectric 143 sandwiched between the pads 141 and conductor layer 144. The width Wp of the pads 141 has been set to a value commensurate with the terminal width and spacing of the circuit element 500.

Generally, the width of pads determined in this way is larger than the width of the wires extending from the pads.

Also, as described above, in the design of a printed wiring board, generally the dimension in the thickness direction of the printed wiring board is determined to set the impedance of wiring to a predetermined standard value. Furthermore, the width of pads is determined according to the terminal width and spacing of the circuit element.

Thus, methods have been proposed which set the impedance of pads to the same predetermined standard value as the impedance of wiring without changing the dimension in the thickness direction or the pad width. For example, a printed wiring board has been proposed in which the impedance of pads is set to a predetermined standard value by providing holes in that area of a conductor layer which faces the pads with the conductor layer extending parallel to the pads (e.g., see Patent Document: Japanese Patent Laid-Open No. 5-29772 (Paragraphs. 0010 to 0019 and FIG. 1).

FIG. 7 shows part of a printed wiring board disclosed in the above Patent Document, where Part (a) is a partial plan view and Part (b) is a partial sectional view.

Part (a) of FIG. 7 shows a pad 151 through which high-speed signals pass; a wire 152 which extends from the pad 151 and through which high-speed signals travel; ordinary pads such as 153a, 153b, and 153c other than the pad 151, which are connected with power terminals of a circuit element; and three wires 154a, 154b, and 154c extending from the ordinary pads.

Part (b) of FIG. 7 shows two conductor layers 155 and 156 which are spaced from each other and embedded in a dielectric 157; the pads 151, 153a, 153b, and 153c and the wire 152 formed on the top surface 150a ; and an internal wire 158 formed between the two conductor layers 155 and 156 and facing them. High-speed signals travel through the internal wire 158 as is the case with the wire 152.

To indicate clearly that the wire 152 shown in Part (b) of FIG. 7 extends from the pad 151 through which high-speed signals pass, Part (a) of FIG. 7 schematically shows the wiring route of the wire 152, in particular, from the pad 151. Regarding the other wires 154a, 154b, and 154c, which are irrelevant here, wiring routes are omitted in the figure.

In a printed wiring board 150 shown in FIG. 7, the interval T1 from the top surface 150a to the first conductor layer 155 is set in such a way as to make the impedance of the wire 152 equal to a predetermined standard value and the interval T2 between the two conductor layers 155 and 156 is set in such a way as to make the impedance of the internal wire 158 equal to the same standard value. Furthermore, the width Wp of the pads has been set to a value commensurate with the terminal width and spacing of the circuit element connected to the pads.

The printed wiring board 150 has a hole 155a filled with a dielectric in that area of the first conductor layer 155 which faces the pad 151. Consequently, the impedance of the pad 151 equals the impedance between the pad 151 and second conductor layer 156.

In the printed wiring board 150 shown in FIG. 7, the provision of the hole 155a increases the thickness of the dielectric between the pad 151 and conductor layer. Consequently, the impedance of the pad 151 is set to the same standard value as the wire 152.

Methods of setting impedance in single-ended mode have been described so far. Next, methods of setting impedance in differential mode will be described.

First, description will be given of a method of setting wiring impedance in differential mode.

FIG. 8 is an explanatory diagram illustrating a method of setting impedance of differential mode wiring formed on the top surface of a printed wiring board.

In wiring along which signals are transmitted in differential mode (hereinafter such signals are referred to as differential signals), the impedance between the two wires along which the differential signals travel is set to a predetermined standard value (e.g., 100Ω).

A printed wiring board 160 shown in FIG. 8 has the same configuration as the printed wiring board 120 shown in FIG. 3. However, the signals traveling along two wires 161a and 161b are differential signals such as those described above.

In the printed wiring board 160, the impedance Z between the two wires 161a and 161b is the sum (Z1+Z2) of mainly the impedance Z1 between the wire 161a and a conductor layer 162 plus the impedance Z2 between the other wire 161b and the conductor layer 162. Both impedances Z1 and Z2 decrease as wire width W increases and increase as the thickness T of a dielectric 163 sandwiched between the conductor layer 162 and the wires increases. The width W of the two wires 161a and 161b depends on the travel distance of the signals traveling through them, i.e., on the length of the wires. Thus, in the printed wiring board 160, by setting the thickness T of the dielectric 163 sandwiched between the conductor layer 162 and the wires to an appropriate value, it is possible to set the impedance Z between the two wires 161a and 161b to a predetermined standard value.

FIG. 9 is an explanatory diagram illustrating a method of setting impedance of differential mode wiring formed in a printed wiring board.

The configuration of a printed wiring board 170 shown in FIG. 9 is similar in most respects to that of the printed wiring board 130 shown in FIG. 4, and thus description thereof will be omitted. However, two wires 171a and 171b formed in the printed wiring board exist in the same plane within a dielectric 174 and the signals traveling along the two wires 171a and 171b are differential signals.

In the printed wiring board 170 shown in FIG. 9, as is the case with printed wiring board 160 shown in FIG. 8, the width W of the two wires 171a and 171b depends again on their length. Thus, by setting the interval T1 between the wire 171a/171b and first conductor layer 172 as well as the interval T2 between the wire 171a/171b and second conductor layer 173 to appropriate values, it is possible to set the impedance between the two wires 171a and 171b to a predetermined standard value.

Next, description will be given of a method of setting pad impedance in differential mode.

Regarding two pads through which differential signals pass, as described with reference to FIG. 7, it is conceivable to set the impedance between the pads to a predetermined standard value by providing a hole, such as the one shown in Japanese Patent Laid-Open No. 5-29772 mentioned above, in the conductor layer nearest to the pads in the printed wiring board.

FIG. 10 shows part of a printed wiring board on whose top surface multiple pads are formed with multiple wires extending from them, where Part (a) is a partial plan view and Part (b) is a partial sectional view.

Part (a) of FIG. 10 shows two pads 181a and 181b through which differential signals pass; two wires 182a and 182b extending from the two pads. 181a and 181b; ordinary pads other than the pads 181*a* and 181*b* through which differential signals pass, such as pads 183*a* and 183*b* connected with power terminals of a circuit element; and two wires 184*a* and 184*b* extending from the two pads 183*a* and 183*b*.

Part (b) of FIG. 10 shows two conductor layers 185 and 186 which are spaced from each other and embedded in a dielectric 187; the pads 181*a*, 181*b*, 183*a*, and 183*b* formed on the top surface 180*a* of the printed wiring board 180; the two wires 182*a* and 182*b* extending from the two pads 181*a* and 181*b* through which differential signals pass; and two internal wires 188*a* and 188*b* formed between the two conductor layers 185 and 186 and facing them. Differential signals travel along the two internal wires 188*a* and 188*b* as is the case with the two wires 182*a* and 182*b*.

To indicate clearly that the two wires 182*a* and 182*b* shown in Part (b) of FIG. 10 extend from the two pads 181*a* and 181*b* through which differential signals pass, Part (a) of FIG. 10 schematically shows the wiring route of the wires 182*a* and 182*b*, in particular, from the two pads 181*a* and 181*b*. Regarding the other two wires 184*a* and 184*b*, which are irrelevant here, wiring routes are omitted in the figure.

Here, the interval TD1 from the top surface 180*a* to the first conductor layer 185 is set in such a way as to make the impedance between the two wires 182*a* and 182*b* equal to a predetermined standard value (e.g., 100Ω). Similarly, the interval TD2 between the two conductor layers 185 and 186 is set in such a way as to make the impedance between the two internal wires 188*a* and 188*b* equal to the same standard value. Furthermore, the width Wp of the pads has been set to a value commensurate with the terminal width and spacing of the circuit element connected to the pads.

The first conductor layer 185 has two holes 185*a* and 185*b* in those areas which face the two pads 181*a* and 181*b*, respectively, through which differential signals pass.

In the printed wiring board 180 shown in FIG. 10, as in the case of the printed wiring board described with reference to FIG. 7, the holes are provided to make the impedance between the pad 181*a* and second conductor layer 186 equal to the impedance between the wire 182*a* and first conductor layer 185. This is also true of the pad 181*b*.

However, with the printed wiring board 180 shown in FIG. 10, the impedance between the two pads 181*a* and 181*b* is lower than the impedance between the two wires 182*a* and 182*b*. Thus, the problem is that it is difficult to set the impedance between the two pads 181*a* and 181*b* to the same standard value as the impedance between the two wires 182*a* and 182*b*.

This problem arises not only when differential signals are transmitted through a pad group consisting of two pads, but also when signals are transmitted through a pad group consisting of three or more pads.

SUMMARY OF THE INVENTION

In view of the above circumstances, the present invention has an object to provide a printed wiring board where the impedance between pads which compose a pad group and through which signals pass has been set to a predetermined standard value.

To achieve the above object, the present invention provides a first printed wiring board in which at least two conductor layers spaced from each other in the thickness direction and parallel to the top surface are embedded in a dielectric and a plurality of pads are formed on the top surface with a plurality of wires extending from the pads, wherein:

a first conductor layer closest to the top surface out of the at least two conductor layers extends over an area excluding a hole formed for each pad group and filled with a dielectric, the hole encompasses a plurality of areas facing predetermined respective pads which are adjacent to each other and which form the pad group from among the plurality of pads; and a second conductor layer more distant from the surface out of the conductor layers extends over an area containing areas facing the hole.

In the first printed wiring board according to the present invention, the first conductor layer has one hole each for each pad group.

The reasons for the prior art problem described above, namely, the problem that the impedance between the two pads 181*a* and 181*b* through which differential signals pass does not take the same standard value as the impedance between the two wires 182*a* and 182*b* extending from the pads in the printed wiring board 180 shown in FIG. 10 include the following. Specifically, in the printed wiring board 180 shown in FIG. 10, the first conductor layer 185 has a remaining section 185*c* between the two holes 185*a* and 185*b*. In the printed wiring board 180, since the impedance between the two pads 181*a* and 181*b* is affected by the remaining section 185*c*, the impedance between the pads does not take the same standard value as the impedance between the two wires 182*a* and 182*b*.

The first printed wiring board of the present invention has only one hole for each pad group unlike the printed wiring board 180 shown in FIG. 10. Consequently, the part which corresponds to the remaining section 185*c* in the printed wiring board 180 shown in FIG. 10 is included in this single hole. Thus, in the first printed wiring board of the present invention, the impedance between the pads composing a pad group can be set to the same standard value as the impedance between the wires extending from the pads.

The first printed wiring board according to the present invention may comprise an internal wire which is laid in an area excluding the area facing the hole and extends parallel to the top surface between the first conductor layer and the second conductor layer.

When the first printed wiring board of the present invention has the internal wire, since the internal wire extends over an area excluding the area facing the hole, it is possible to make effective use of the interior of the printed wiring board while preventing the internal wire from affecting the impedance between the pads composing each pad group.

To achieve the above object, the present invention also provides a second printed wiring board in which a conductor layer parallel to the top surface is embedded in a dielectric and on which a plurality of pads are arranged with a plurality of wires extending from the pads, wherein the conductor layer includes only one area provided for each pad group and displaced in the thickness direction, the one area encompasses a plurality of areas facing predetermined respective pads which are adjacent to each other and which form the pad group from among the plurality of pads.

The second printed wiring board according to the present invention, even if it has only one conductor layer in the dielectric, allows the impedance between the pads to be set to a predetermined standard value by setting the size of the area which encompasses the areas facing the respective pads composing each pad group in the conductor layer as well as by setting the displacement of this area in the thickness direction with respect to other areas to appropriate values.

As described above, according to the first and second printed wiring boards of the present invention, the impedance of multiple pads composing a pad group through which signals pass is set to a predetermined standard value.

DETAILED DESCRIPTION OF THE PREFERRED EMBODIMENTS

Embodiments of the present invention will be described below.

Figure 11:
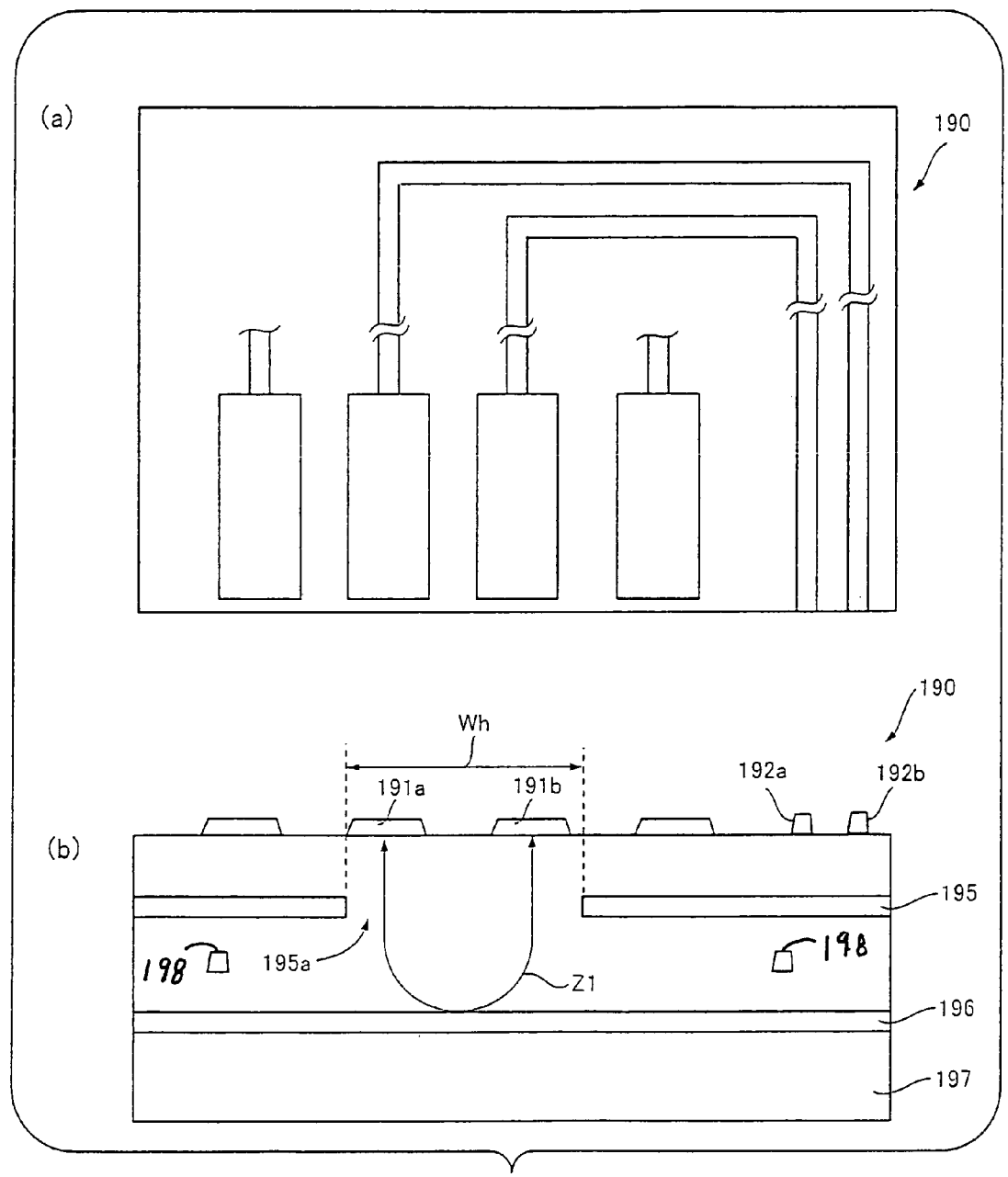
FIG. 11 shows an embodiment of a first printed wiring board according to the present invention, where Part (a) is a partial plan view and Part (b) is a partial sectional view.

FIG. 11 shows an embodiment of a first printed wiring board according to the present invention, where Part (a) is a partial plan view and Part (b) is a partial sectional view.

Figure 1:
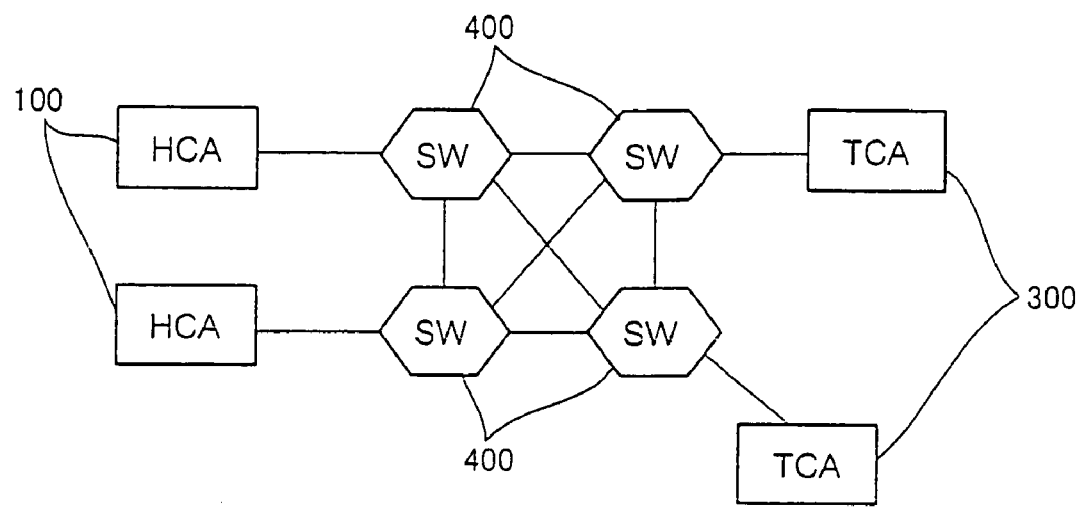
FIG. 1 is a diagram conceptually showing a network which sends and receives signals by high-speed serial transmission.
Figure 2:
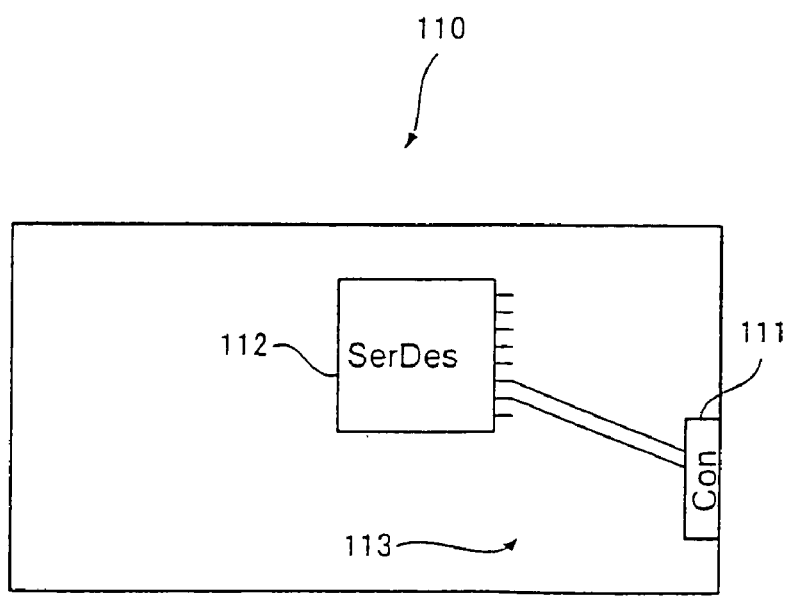
FIG. 2 is a diagram showing a PCI (Peripheral Component Interconnect) card, which is an example of HCAs.
Figure 3:
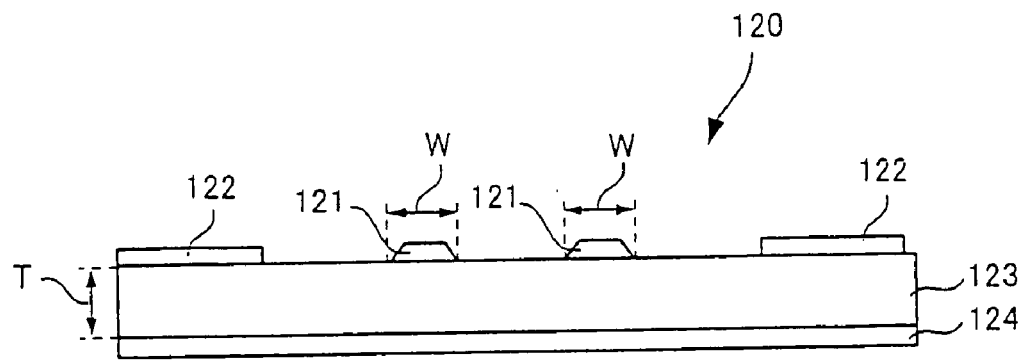
FIG. 3 is a diagram illustrating a method of setting impedance of single-ended mode wiring formed on the top surface of a printed wiring board.
Figure 4:
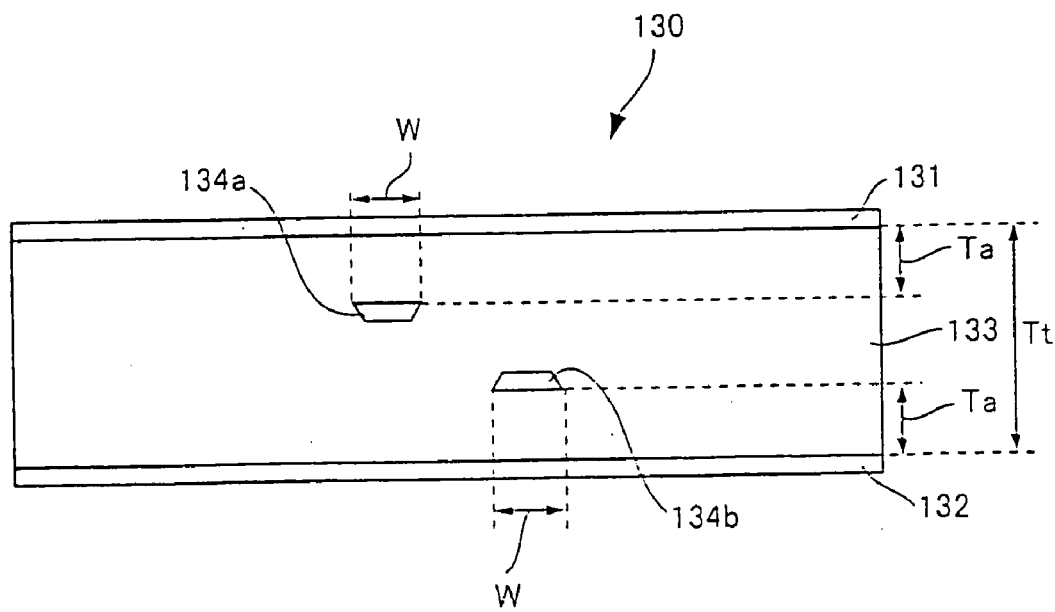
FIG. 4 is a diagram illustrating a method of setting impedance of single-ended mode wiring formed in a printed wiring board.
Figure 5:
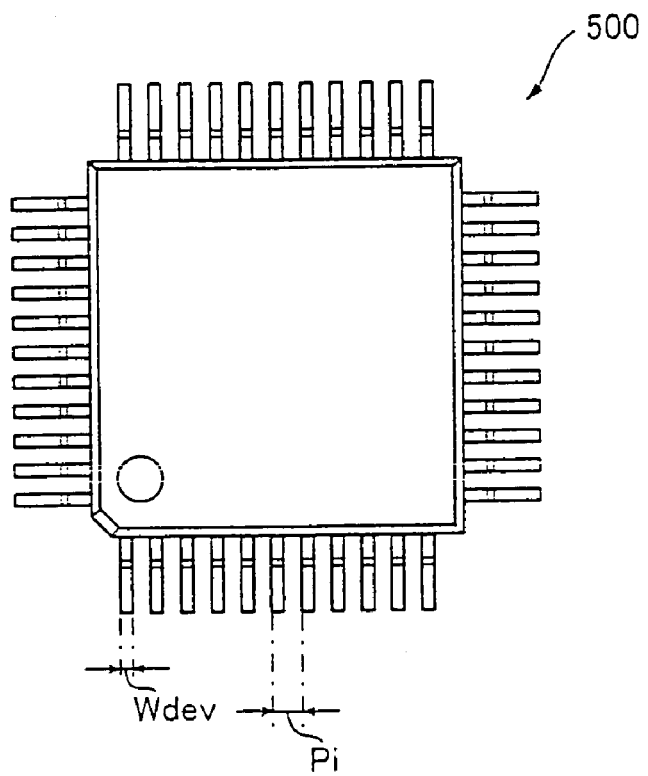
FIG. 5 is a diagram showing an example of a circuit element.
Figure 6:
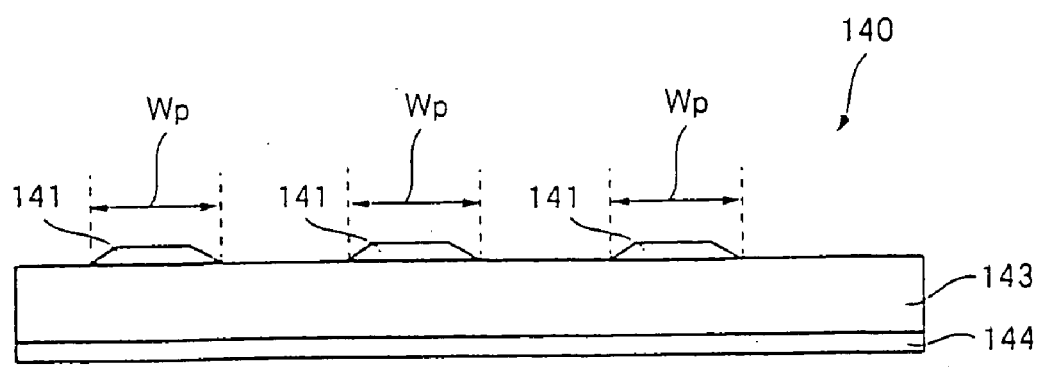
FIG. 6 is a partial sectional view showing part of a printed wiring board on which the circuit element is mounted.
Figure 7:
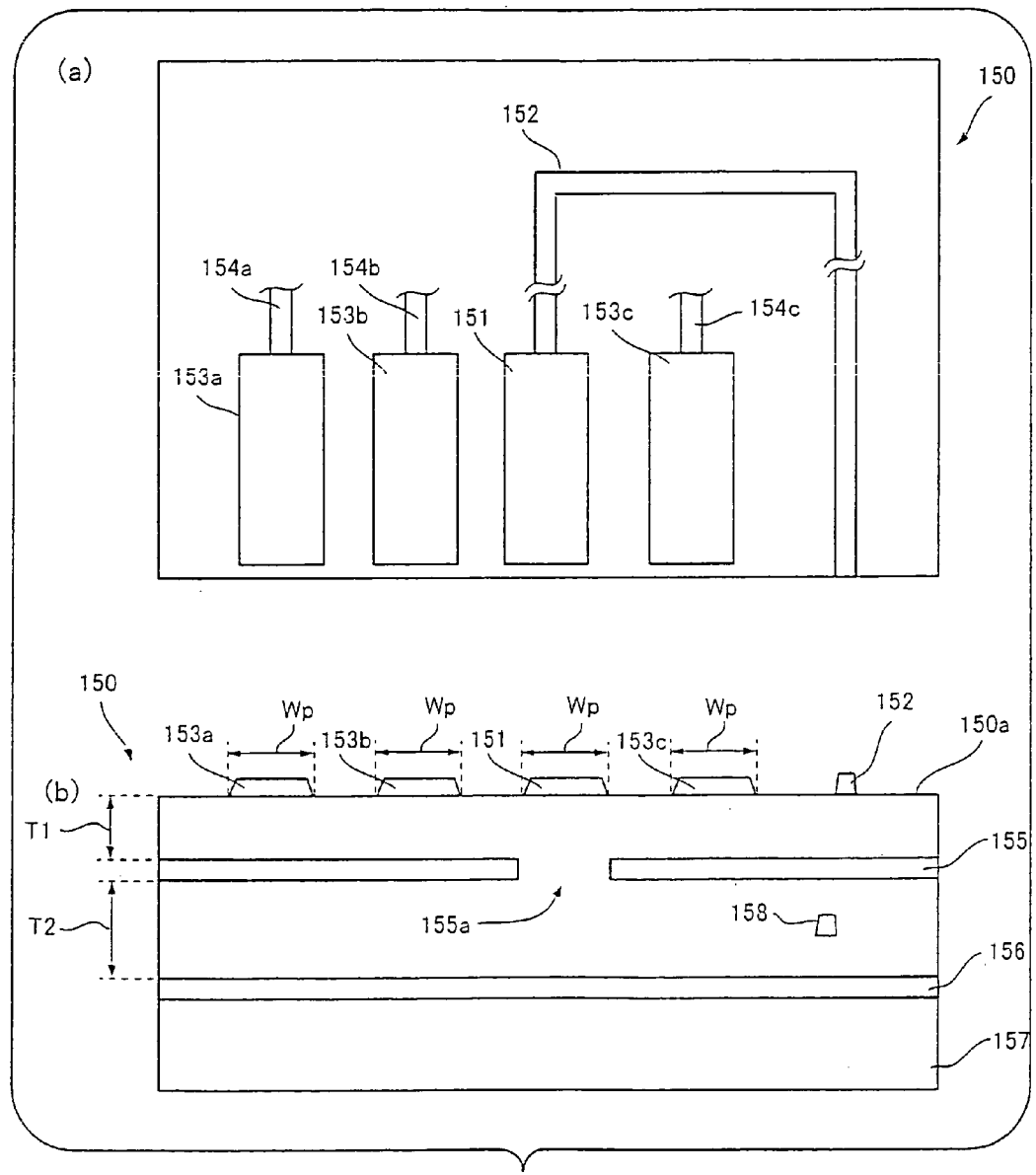
FIG. 7 shows part of a printed wiring board disclosed in Japanese Patent Laid-Open No. 5-29772, where Part (a) is a partial plan view and Part (b) is a partial sectional view.
Figure 8:
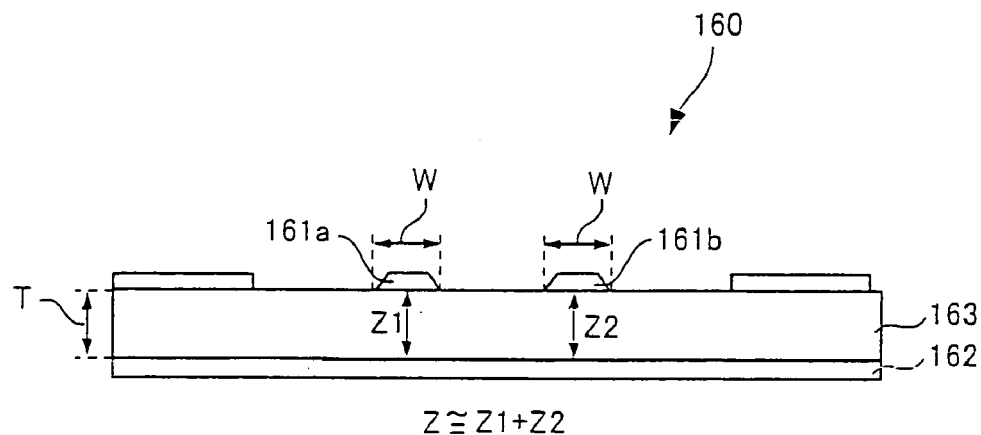
FIG. 8 is an explanatory diagram illustrating a method of setting impedance of differential mode wiring formed on the top surface of a printed wiring board.
Figure 9:
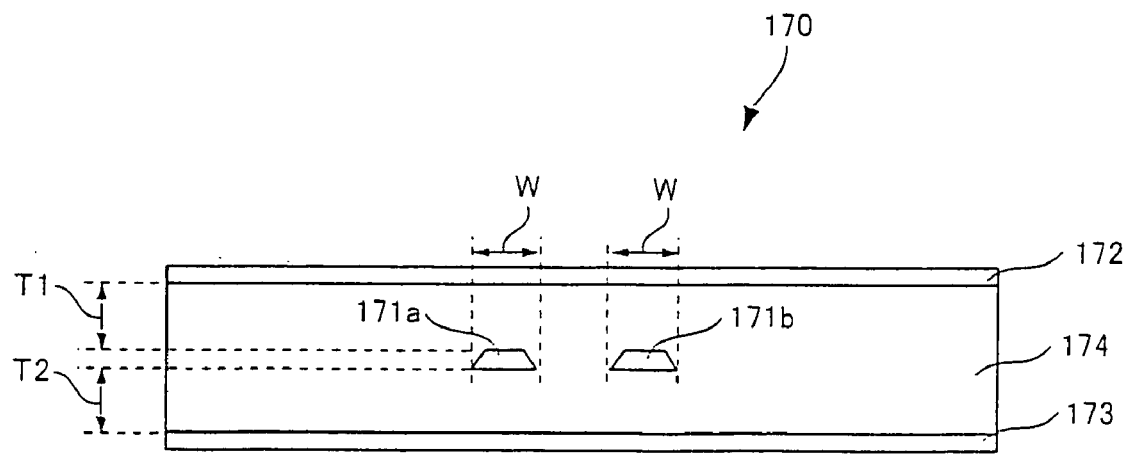
FIG. 9 is an explanatory diagram illustrating a method of setting impedance of differential mode wiring formed in a printed wiring board.
Figure 10:
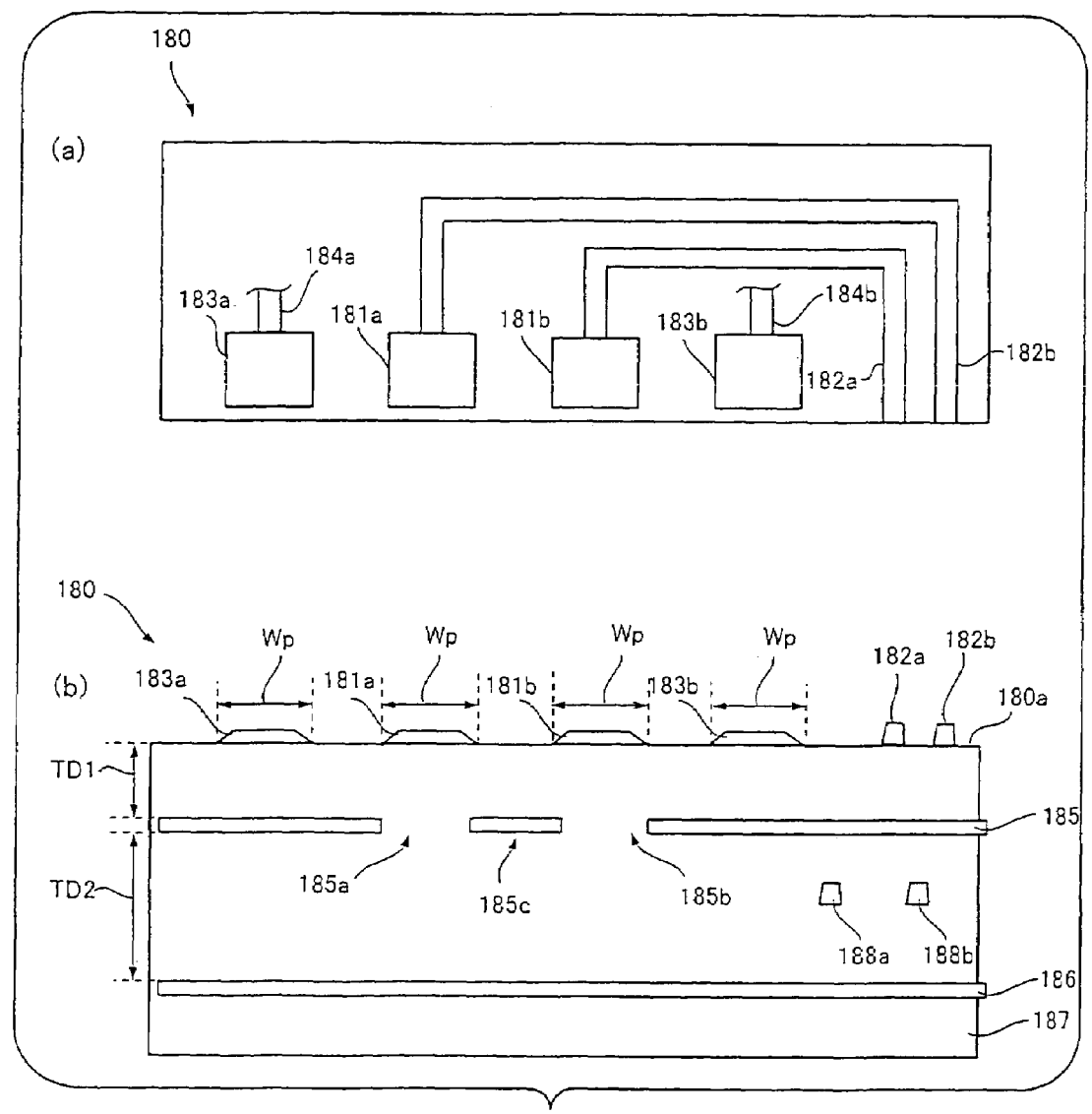
FIG. 10 shows part of a printed wiring board on whose top surface multiple pads are formed with multiple wires extending from them, where Part (a) is a partial plan view and Part (b) is a partial sectional view.

The printed wiring board 190 shown in FIG. 11 has the same configuration as the printed wiring board 180 shown in FIG. 10 except for a first conductor layer 195 shown in Part (b) of FIG. 11, and thus only the difference, i.e., the first conductor layer 195 shown in Part (b) of FIG. 11, will be described, omitting redundant description.

The first conductor layer 195 of the printed wiring board 190 shown in FIG. 11 extends over an area excluding a hole 195a formed for each pad group and filled with a dielectric 197. The hole 195a contains two areas facing two respective pads 191a and 191b composing a pad group.

The impedance between the two pads 191a and 191b is the sum Z1 of mainly the impedance between the pad 191a and a second conductor layer 196 plus the impedance between the pad 191b and second conductor layer 196. In the printed wiring board 190, since the dielectric 197 has a part sandwiched between the two pads (191a and 191b) and first conductor layer 195 thicker than a part sandwiched between two wires (192a and 192b) whose inter-wire impedance has been set to a predetermined standard value and the first conductor layer 195, the impedance Z1 has been set to the predetermined standard value. An internal wire 198 is formed between the two conductor layers 195 and 196 in the area excluding the hole 195a formed for each pad group.

Furthermore, the printed wiring board 190 allows the impedance between the two pads 191a and 191b to be set accurately to the standard value by adjusting the width Wh of the hole 195a in the first conductor layer 195 during design.

Figure 12:
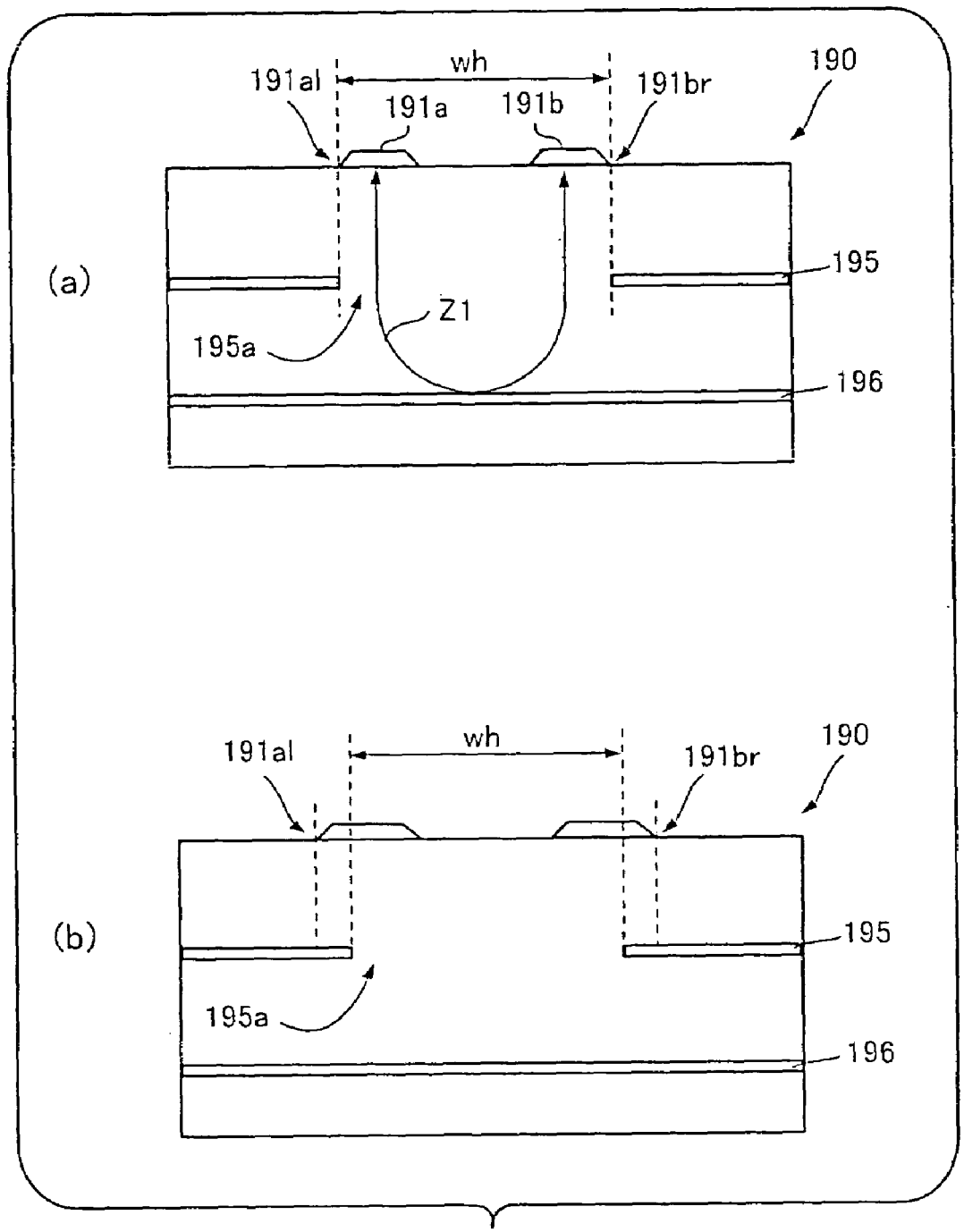
FIG. 12 is a diagram showing the impedance between two pads through which differential signals pass vs. the width of a hole in a first conductor layer in the printed wiring board shown in FIG. 11.

FIG. 12 shows the impedance between the two pads through which differential signals pass vs. the width of the hole in the first conductor layer in the printed wiring board according to the present embodiment.

Part (a) of FIG. 12 shows a case in which the width Wh of the hole 195a in the first conductor layer 195 is set equal to the interval between an end 191al of the pad 191a and an end 191br of the pad 191b while Part (b) of FIG. 12 shows a case in which the width Wh of the hole 195a in the first conductor layer 195 is set slightly narrower than the interval between the end 191al of the pad 191a and the end 191br of the pad 191b.

In both Part (a) and Part (b) of FIG. 12, the impedance between the two pads 191a and 191b is the sum Z1 of mainly the impedance between the pad 191a and second conductor layer 196 plus the impedance between the pad 191b and second conductor layer 196. However, in Part (b) of FIG. 12, the two pads 191a and 191b partially overlap with the first conductor layer 195. The impedance between the two pads 191a and 191b decreases with increases in the overlapping range Ov and increases with decreases in the overlapping range Ov.

Also, the first printed wiring board of the present invention has internal wiring in an area excluding the area facing the hole in the first conductor layer.

Figure 13:
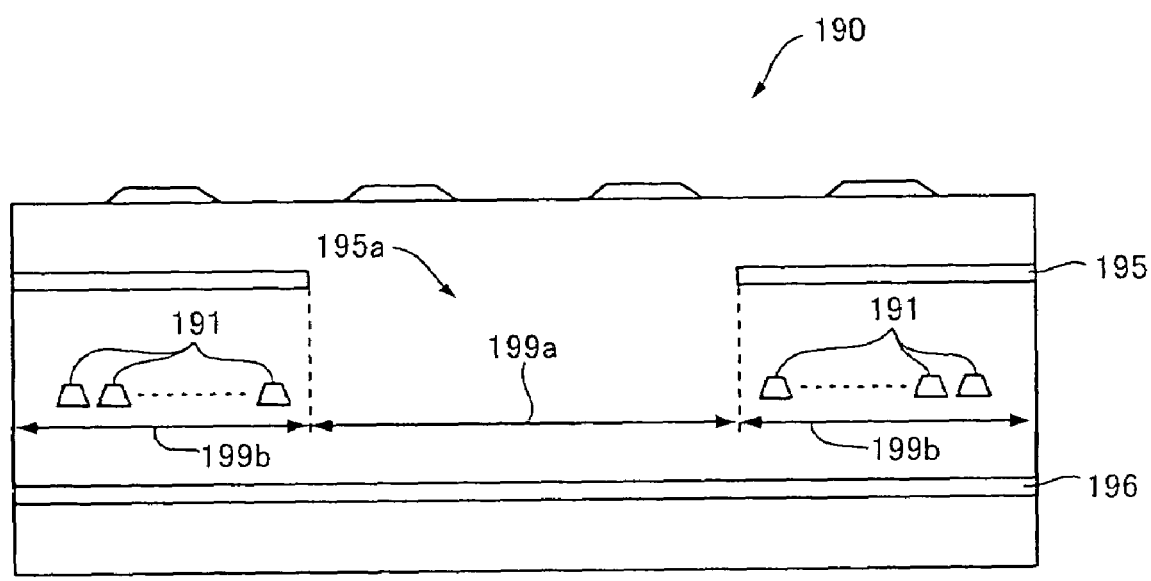
FIG. 13 is a partial sectional view showing an internal wiring area in the first printed wiring board of the present invention.

FIG. 13 is a partial sectional view showing internal wiring in the printed wiring board according to the present embodiment.

FIG. 13 schematically shows the printed wiring board 190 in which internal wires 191 are formed between the first conductor layer 195 and second conductor layer 196 in an area 199b excluding the area 199a facing the hole 195a.

Figure 14:
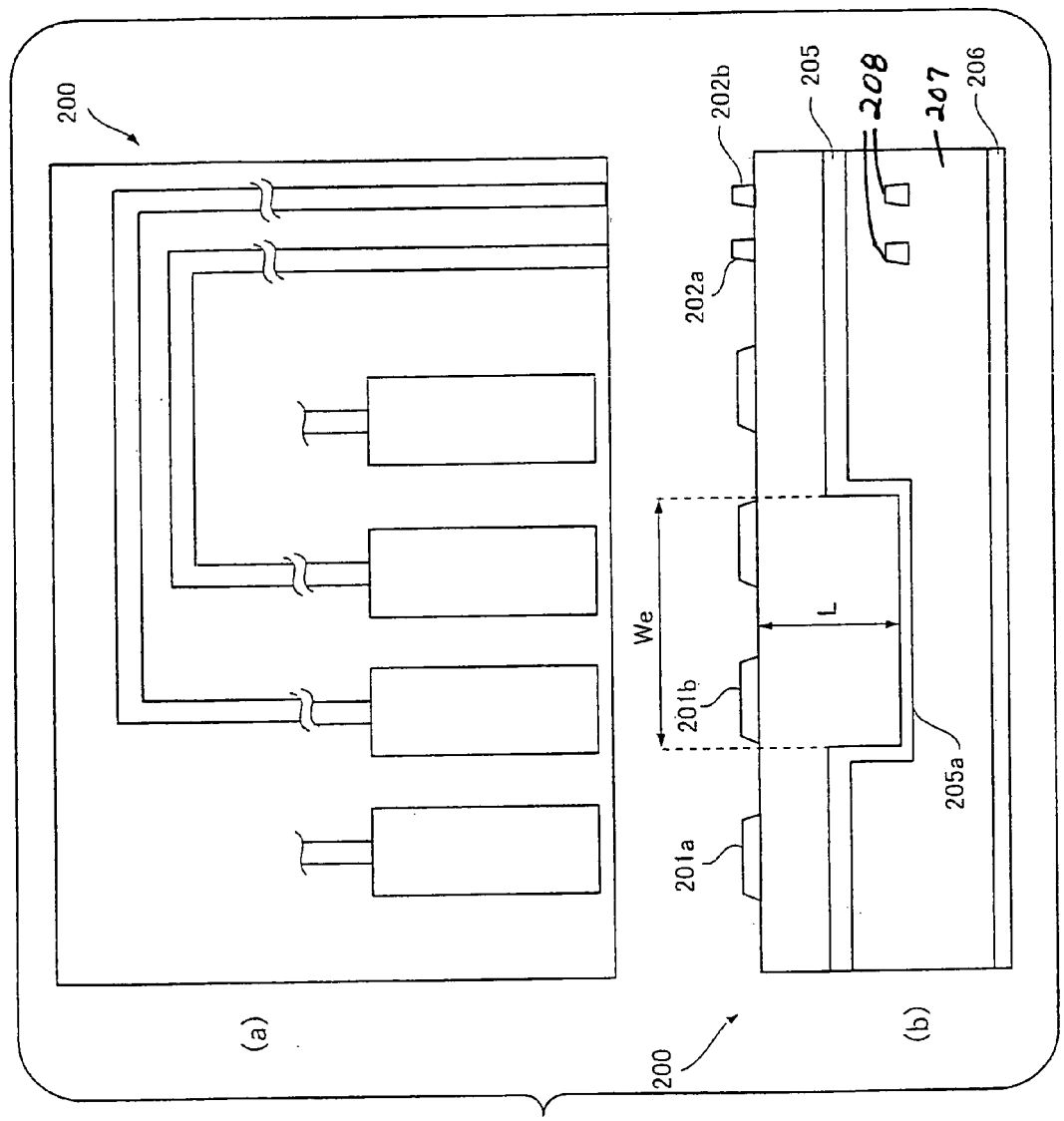
FIG. 14 shows an embodiment of a second printed wiring board according to the present invention, where Part (a) is a partial plan view and Part (b) is a partial sectional view.

FIG. 14 shows an embodiment of a second printed wiring board according to the present invention, where Part (a) is a partial plan view and Part (b) is a partial sectional view.

The printed wiring board 200 shown in FIG. 14 has the same configuration as the printed wiring board 190 shown in FIG. 11 except for the configuration of a conductor layer 205 shown in Part (b) of FIG. 14 and except that a second conductor layer 206 is formed on the bottom surface of a dielectric substrate in the printed wiring board 200. An internal wire 208 is formed between the two conductor layers 205 and 206. Thus, only the differences will be described, omitting redundant description of the same components as the printed wiring board 190 shown in FIG. 11.

In the first conductor layer 205 shown in Part (b) of FIG. 14, an area 205a which extends over two areas facing the two respective pads 201a and 201b through which differential signals pass is displaced in the thickness direction with respect to the other area.

In the printed wiring board 200 the second conductor layer 206 is formed on the bottom surface of the dielectric substrate 207, playing the role of shielding internal wiring and adjusting its impedance. Provision of a hole in the first conductor layer 206, as is the case with Part (b) of FIG. 11, makes the thickness of the dielectric 207 between the pads and the second conductor layer 208 too large. Thus, the impedance of the pads is adjusted by displacing the area 205a that corresponds to the hole in the first conductor layer in Part (b) of FIG. 11 in the thickness direction. Specifically, the printed wiring board 200 shown in FIG. 14 allows the impedance between the two pads 201a and 201b to be set to a predetermined standard value by adjusting the interval L between the two pads (201a and 201b) and the first conductor layer 205 as well as the width We of the area 205a during design.

Incidentally, in the embodiments described above, one pad group is composed of two pads, but one pad group may be composed of three or more pads.

What is claimed is:

1. A printed wiring board, comprising:
    at least two conductor layers spaced from each other in a thickness direction and parallel to a top surface of the printed wiring board, and embedded in a dielectric;
    a plurality of pads formed on the top surface with a plurality of wires extending from the pads,
    wherein at least two of the plurality of pads are adjacent to each other to form a pad group where differential signals pass and each of the at least two of the plurality of pads have an impedance value, and
    a hole formed in the dielectric and filled with the dielectric to define a first area below the pad group;
    wherein a first conductor layer of the at least two conductor layers is closest to the top surface and extends over a second area of the dielectric outside of the first area,
    a second conductor layer of the at least two conductor layers is formed below the first conductor layer and extends below the first area,
    a sum of the impedance values for each of the at least two of the plurality of pads is a predetermined impedance, and
    the predetermined impedance is set by the differential signals sent by the at least two of the plurality of pads to the second conductor layer.

2. The printed wiring board according to claim 1, comprising:
    an internal wire formed in the second area, and
    extending parallel to the top surface between the first conductor layer and the second conductor layer.

3. The printed wiring board according to claim 1, wherein the predetermined impedance is adjusted by displacing a distance between the at least two of the plurality of pads in the first area.

4. The printed wiring board according to claim 1, wherein the predetermined impedance is adjusted by varying a width of the hole in the first area.

5. A printed wiring board, comprising:
    at least two conductor layers spaced from each other in a thickness direction of the printed wiring board and embedded in a dielectric;
    a plurality of pads arranged with a plurality of wires extending from the plurality of pads formed on a top surface of the printed wiring board,
    wherein at least two of the plurality of pads form a pad group in a first area of the printed wiring board;
    a first conductor layer of the at least two conductor layers includes a first portion extending parallel to a top surface of the printed wiring board in a second area outside the first area and at a first distance from the top surface and a second portion of the first conductor layer extending parallel to the top surface in the first area and at a second, greater distance from the top surface and;
    a second conductor layer of the at least two conductor layers formed below the first conductor layer and parallel to the top surface of the printed wiring board and formed in the second area at a third distance from the top surface that is greater than the second distance.

6. The printed wiring board according to claim 5, wherein the second conductor layer is formed at a bottom surface of the dielectric substrate.

* * * * *